US008299864B2

(12) United States Patent
Tanaka

(10) Patent No.: US 8,299,864 B2
(45) Date of Patent: Oct. 30, 2012

(54) VOLTAGE CONTROLLED TEMPERATURE COMPENSATED CRYSTAL OSCILLATOR

(75) Inventor: Yoshikatsu Tanaka, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 32 days.

(21) Appl. No.: 13/065,040

(22) Filed: Mar. 11, 2011

(65) Prior Publication Data

US 2011/0234325 A1    Sep. 29, 2011

(30) Foreign Application Priority Data

Mar. 26, 2010    (JP) ................................ 2010-073077

(51) Int. Cl.
H03B 5/32    (2006.01)
(52) U.S. Cl. .......... 331/158; 331/116 R; 331/68; 331/69
(58) Field of Classification Search .............. 331/108 C, 331/158, 68, 69, 116 R
See application file for complete search history.

(56) References Cited

U.S. PATENT DOCUMENTS 6,870,430 B2 * 3/2005 Nakamura et al. ............... 331/18
7,471,162 B2 * 12/2008 Ishikawa et al. ................. 331/68

FOREIGN PATENT DOCUMENTS

JP    2003-324318    11/2003

OTHER PUBLICATIONS

Miniature Surface Mounted VC-TCXO Module (DSA222MAA) Catalog published by Daishinku Corp. described in attached product catalog downloaded from Daishinku Corp. website.

* cited by examiner

Primary Examiner — Arnold Kinkead
(74) Attorney, Agent, or Firm — Edwards Wildman Palmer LLP; Scott D. Wofsy

(57) ABSTRACT

The invention provides a multifunctional VC-TCXO that, as well as promoting miniaturization, selectively configures the functions as needed, and furthermore, is suitable for power savings. In a VC-TCXO provided with a chamber body that accommodates an IC chip and a crystal blank, the IC chip has; basic functions consisting of a first oscillator output function, and a temperature compensating function, and additional functions comprising of a second oscillator output function, an operation/non-operation function of the first oscillator output, and a temperature voltage output function, and basic IC terminals and additional IC terminals for these functions, and basic mounting terminals, and additional mounting terminals. Two of the additional IC terminals are two functions among the additional functions, which are selectively connected according to changes in a circuit pattern of a surface layer of the circuit formation surface, and the basic mounting terminals are provided on four corner portions of an outside bottom surface of the chamber body, and the two additional mounting terminals that are connected to the two additional IC terminals are provided on a central portion of a long side facing the outside bottom surface.

3 Claims, 9 Drawing Sheets

VOLTAGE CONTROLLED TEMPERATURE COMPENSATED CRYSTAL OSCILLATOR

TECHNICAL FIELD

The present invention relates to a voltage controlled temperature compensated crystal oscillator for surface mounting (a so-called VC-TCXO, hereafter "crystal oscillator"), in particular to a multifunctional compact crystal oscillator.

BACKGROUND ART

1. Background of the Invention

Among crystal oscillators, VC-TCXO (Voltage Controlled-Temperature Compensated Crystal Oscillators) compensate the frequency temperature characteristics of crystal resonators, and for example, maintain the oscillation frequency at a nominal value (nominal frequency) by means of a voltage from an AFC circuit. As a result they are applied as frequency reference sources in communication devices such as mobile phones, which follow environmental changes. In recent years, user demand has diversified, and for example, with regard to mobile phones, there is a multifunctional temperature compensated crystal oscillator in which; a reference signal source for a PLL having an operation/non-operation function (ON/OFF of an oscillator output), and an output terminal serving as a block signal source, are provided discretely.

2. Prior Art

FIG. 5 illustrates a conventional example of a crystal oscillator (VC-TCXO), wherein FIG. 5A is a cross-sectional view thereof, FIG. 5B is a plan view of the inside bottom surface of the chamber body thereof viewed excluding the cover, and FIG. 5C is a plan view of the outside bottom surface thereof.

This crystal oscillator, for example, as shown in FIG. 5A, accommodates an IC chip 2 and a crystal blank 3 within a concave-shaped cross-section chamber body 1 composed of a laminated ceramic, and is hermetically sealed by joining a metal cover 4 to the top end surface of the chamber body 1. The chamber body 1 has; a pair of crystal holding terminals 5 at an inside wall stepped portion of the concave portion, circuit terminals 6 on the inside bottom surface 1a thereof, and mounting terminals 7 on the outside bottom surface 1b. The crystal holding terminals 5 are electrically connected to crystal terminals of the circuit terminals 6, and furthermore, the circuit terminals 6, excluding the crystal terminals, are electrically connected to the mounting terminals 7 provided on the outside bottom surface 1b by means of conductive paths including through electrodes (not shown in the figure). The IC chip 2 is fixed to the inside bottom surface 1a of the chamber body 1 by ultrasound thermocompression bonding using a bump (not shown in the figure) for example (so-called "flip-chip bonding").

As shown in FIG. 6, the crystal blank 3 has excitation electrodes 8a on both principal surfaces thereof, and lead-out electrodes 8b extend to both sides of one end. As shown in FIG. 5A, both sides of one end of the crystal blank 3 from which the lead-out electrodes 8b extend, are fixed to the crystal holding terminals 5 provided on the inside wall stepped portion by an electrically conductive adhesive 9. Furthermore, the metal cover 4 is joined by seam welding, for example, to a metal ring (not shown in the figure) provided at the open end surface of the chamber body 1 so as to hermetically seal the crystal blank 3 and the IC chip 2 within the chamber body 1. In a state in which the crystal blank 3 is hermetically sealed, these are referred to as a crystal resonator or a crystal unit.

(Basic Circuit Configuration)

The basic circuit configuration of a conventional VC-TCXO shown in FIG. 7 is one that is integrated within the IC chip 2 shown in FIG. 5A, and has a voltage controlled oscillation circuit and a temperature compensating device (not shown in the figure). That is to say, it has basic functions of a first oscillator output function, wherein the oscillation frequency is controlled by a control voltage, and a temperature compensating function. The oscillation circuit is formed together with an external crystal resonator (crystal blank 3), and is made a voltage controlled type by inserting into an oscillation closed loop, a voltage variable capacitative element (not shown in the figure) such as a varicap diode, to which the control voltage is applied. The control voltage is an automatic frequency control (AFC) voltage from an AFC circuit for example, and this is applied to the voltage variable capacitative element and matched with the nominal frequency.

As shown in FIG. 7, the temperature compensating device includes, at the very least, a temperature sensor 11 which is a linear resistance for example, that detects ambient temperature, and generates a detection voltage corresponding to the ambient temperature. The resulting temperature compensation voltage is, for example, applied to the aforementioned voltage variable capacitative element. Furthermore, in particular, changes in the oscillation frequency originating from the frequency temperature characteristics of the crystal resonator are offset by this voltage, to compensate the temperature.

The temperature compensation voltage is supplied at all times during operation of the oscillation circuit, and the AFC voltage is supplied when necessary from the AFC circuit built-in to mobile phones in which the crystal oscillator is installed. Furthermore, the temperature compensation data for the temperature compensating device is written using the mounting terminals 7 (Vcc, Vout, GND, Vafc) shown in FIG. 5C, which have a basic function. Moreover, the mounting terminals 7 which have a basic function, are disposed in a clockwise direction starting with the upper left diagonal shown in FIG. 5C in the order of, for example, power supply, first oscillator output, earth, control voltage, and AFC input terminals (Vcc, Vout, GND, Vafc).

(Multifunctionalization of the VC-TCXO)

Furthermore, in a case where the VC-TCXO is made multifunctional, as shown in FIG. 7, the oscillator output of the VC-TCXO is branched in parallel for example, and is made a first output Vout1 and a second oscillator output Vout2 via first and second buffer amplifiers 12a and 12b. The buffer amplifiers 12 prevent waveform distortions or the like, resulting from mutual interference between the first and second oscillator outputs Vout1 and Vout2.

Here, the first and second oscillator outputs Vout1 and Vout2 are both clipped sine waves. The first oscillator output Vout1 is a normal standard signal source of a synthesizer from a PLL for when the received frequency is made an intermediate frequency for example. Furthermore, the second oscillator output Vout2 is a baseband clock source serving as a continuous output. An operation/non-operation signal (Vcd) corresponding to the intermittent operation of the PLL circuit is applied to the first buffer amplifier 12a for example, and it has an operation/non-operation function that turns the first oscillator output Vout1 ON/OFF. The operation/non-operation signal is applied to the base of the first buffer amplifier 12a or to the switch of the power lines. Furthermore, the operation/non-operation function corresponds to a standby function in a clock oscillator, and has an object in power savings.

In addition, the detected temperature voltage from the temperature sensor 11 of the temperature compensating device shown in FIG. 7 is output as temperature data, and is utilized as necessary for temperature compensation of external circuits for example. As a result, additional functions, namely a second oscillator output function, an operation/non-operation function, and a temperature voltage output function, are added to the basic functions of the VC-TCXO.

Due to this, on one principal surface (circuit formation surface) of the IC chip 2, as shown in FIG. 8A, there is provided as IC terminals 13, in addition to basic IC terminals 13a, namely crystal terminals X1 and X2, the power terminal Vcc, the first oscillator output terminal Vout1, the AFC input terminal Vafc, and the earth terminal GND, additional IC terminals 13b, namely the second oscillator output terminal Vout2, an operation/non-operation input terminal Ved, and a temperature output terminal Vtsens, to give a total of nine terminals. As shown in FIG. 8B, the terminals are provided on both sides along the length direction of the IC chip 2, and a dummy terminal (NC) that maintains the symmetry is provided to give a total of ten terminals.

In FIGS. 8A and 8B, the reference symbols 13a and 13b of the basic IC terminals and the additional IC terminals are conveniently omitted, and all of the IC terminals are denoted by reference symbol 13. Furthermore, the corresponding basic and additional mounting terminals 7a and 7b, and additionally, the basic and additional IC intermediate terminals 13a' and 13b' are omitted to illustrate from FIGS. 8A and 8B, and the mounting terminals and the IC intermediate terminals are denoted by reference symbols 7 and 13', respectively, in the present specification.

The aforementioned circuit terminals 6 formed on the inside bottom surface 1a of the chamber body 1 are formed corresponding to these IC terminals 13. Furthermore, except for the crystal terminals X1 and X2 shown in FIG. 7, they are electrically connected to the mounting terminals 7 provided on the outside bottom surface 1b of the chamber body 1 by means of a wiring path (circuit pattern) including through electrodes (through holes), or the like. However, there are two earth electrodes GND among the mounting terminals 7 to give a total of eight terminals, and the symmetry is maintained.

[Patent Document 1] Japanese Unexamined Patent Publication No. 2003-324318
[Non-Patent Document 1] Miniature Surface Mounted VC-TCXO Module (Model Name: DSA222MAA) Catalog published by Daishinku Corp.

SUMMARY OF THE INVENTION

Problems to be Solved by the Invention (Problems in Prior Art)

However, in conventional crystal oscillators (VC-TCXO) of the aforementioned configuration, as miniaturization thereof proceeds, for example, when the external shape in plan view becomes 2.0×1.6 mm or less for example, from 3.2×2.5 mm or 2.5×2.0 mm (all of which are established standard dimensions), it becomes difficult to form all (a total of seven) of the mounting terminals 7 (Vcc, Vout1, Vout2, Vafc, Vstv, GND) on the outside bottom surface thereof, even if the earth electrode 7 is made a single electrode.

Furthermore, since the external shape in plan view of the chamber body 1 is made smaller, it is necessary to make the size of the IC chip smaller. In this case, normally, as shown in FIG. 9, the dimensions of the circuit terminals 6 of the inside bottom surface 1a of the chamber body 1 are made larger than the IC terminals 13, preventing positional displacement of the bumps 14 at the time of ultrasound thermocompression. However, in the aforementioned conventional example, since the circuit terminals 6 corresponding to the IC terminals 13 are a total of 10 terminals, there is a problem in that it becomes difficult to form the terminals on the inside bottom surface 1a with an external shape in plan view of 2.0×1.6 mm.

Moreover, this conventional example is, in addition to the conventional basic function of a VC-TCXO, provided with three additional functions of an operation/non-operation function (Enable/Disable) of the first oscillator output Vout serving as a standard signal source for a PLL, a second oscillator output function (clock function), and a temperature voltage output function of the detected temperature voltage. However, in reality, there are many cases where, among these three additional functions, for example only one of the functions, or two of the functions, are needed.

For example, in a case where only the first oscillator output function and the operation/non-operation function thereof serving as a standard signal source, and the temperature voltage output function are needed, there is a problem in that power saving is inhibited. That is to say, the aforementioned conventional example has a first and a second oscillator output function, and the second oscillator output (clock signal) Vout2 is obtained by branching from the first oscillator output Vout1 (standard signal). Accordingly, if the operation of the VC-TCXO is stopped, not only the first oscillator output Vout1, but also the second oscillator output Vout2 can no longer be obtained.

Due to this, in the aforementioned conventional example, the operation of the VC-TCXO itself is continued, the operation of the first buffer amplifier 12a of the first oscillator output Vout1 is stopped, and the first oscillator output is made the operation/non-operation function. Consequently, even in a case where the second oscillator output function is unnecessary, the operation/non-operation function of the first oscillator output is continued by the operation of the VC-TCXO itself. Therefore there is a problem in that power saving is inhibited.

Object of the Invention

An object of the present invention is to provide a multi-functional crystal oscillator (VC-TCXO) that, as well as promoting miniaturization, selectively configures the functions as needed, and furthermore, is suitable for power savings.

Means for Solving the Problem (Specific points)

In the present invention, a specific point is that although the crystal oscillator of the aforementioned configuration is provided with, in addition to the conventional basic function of a VC-TCXO, three additional functions of an operation/non-operation function of the first oscillator output (standard signal), a second oscillator output function (clock function), and a temperature voltage output function as mentioned above, there are many cases where only one of the functions, or two of the functions, are needed.

(Concept)

Therefore in the present invention, one of the three additional mounting terminals 7 corresponding to the operation/non-operation, clock, and temperature voltage output functions, that is to say, the operation/non-operation input terminal Ved, the second oscillator output terminal (clock terminal) Vout2, and the temperature output terminal, is excluded to give two terminals, and as shown in FIG. 1C, together with the four terminals of the original basic mounting terminals 7 (Vcc, Vout1, Vafc, GND) of the VC-TCXO, gives six terminals.

In this case, the exclusion of the unnecessary functions among the operation/non-operation, second oscillator output, and temperature voltage output functions, from the IC chip 2 may also be considered. However, in this case, since there is a need to form an IC chip 2 corresponding to each, the basic configuration of the IC chip 2 is basically unchanged and is made common, and this is addressed by changing only the surface layer pattern of the IC chip.

(Solution)

The crystal oscillator of the present invention is configured as follows.

That is to say the construction is such that, an IC chip and a crystal blank are accommodated in a chamber body, and at the very least, the crystal blank is hermetically sealed, and mounting terminals that are electrically connected to the IC chip are provided on an outside bottom surface of the chamber body, which is made rectangular in plan view, the IC chip has basic functions consisting of a first oscillator output function, wherein a voltage variable capacitative element to which a control voltage is applied is inserted within an oscillator closed loop, and a temperature compensating function that at the very least has a temperature sensor and compensates for the frequency temperature characteristics arising in the crystal blank, and additional functions other than the basic functions, comprising of a second oscillator output function, an operation/non-operation function of the first oscillator output, and a temperature voltage output function, and one principal surface that serves as a circuit formation surface of the IC chip has IC terminals, and the IC terminals comprise, at the very least, basic IC terminals composed of a pair of crystal terminals, a power terminal, a first oscillator output terminal, a control voltage input terminal, and an earth terminal, which correspond to the basic functions, and additional IC terminals that correspond to the additional functions, and the mounting terminals have; basic mounting terminals that are electrically connected to the basic IC terminals excluding a pair of crystal terminals, namely a power terminal, a first oscillator output terminal, a control voltage input terminal, and an earth terminal, and additional mounting terminals that are electrically connected such that they correspond to the additional functions, wherein the additional IC terminals of the IC chip are two terminals, and the two additional IC terminals are two terminals among a second oscillator output function, an operation/non-operation function of a first oscillator output, and a temperature voltage output function, which are selectively connected according to changes in a circuit pattern of a surface layer of the circuit formation surface, and the basic mounting terminals are provided on four corner portions of an outside bottom surface of the chamber body, and the two additional mounting terminals that are connected to the two additional IC terminals are provided on a central portion of a long side facing the outside bottom surface.

Effects of the Invention

According to such a construction, the mounting terminals provided on the outside bottom surface of the chamber body serve as the basic mounting terminals corresponding to the basic functions. That is to say, the four terminals of the power terminal, the first oscillator output terminal, the control voltage input terminal, and the earth terminal, and the two additional mounting terminals that are selected as necessary, give a total of six terminals. Accordingly, in comparison to the seven mounting terminals of the conventional example, the crystal oscillator of the present invention has one fewer, which allows an arrangement of three each along the long sides facing the outside bottom surface. Therefore the enhanced functionality of the crystal oscillator is maintained, and the miniaturization thereof can be facilitated.

Furthermore, even when additional functions are added, the basic mounting terminals (the power terminal, the first oscillator output terminal, the control voltage input terminal, and the earth terminal) can be arranged on the four corner portions of the outer bottom surface of the chamber body in the conventional manner. Accordingly, in a case where temperature compensating data, including adjustments and measurements of the frequency, or the like, are written for the temperature compensating function within the IC chip for example, the basic mounting terminals at the four corner portions are used as is. Therefore the need for producing new jigs is eliminated.

Moreover, the IC chip basically has all of the second oscillator output function, the operation/non-operation function, and the temperature voltage output function as additional functions, and the additional IC terminals corresponding to the necessary two functions can be formed by changing the circuit pattern of the circuit formation surface. Accordingly, in comparison to a case where only two functions among the second oscillator output function, the operation/non-operation function, and the temperature voltage output function are selected and integrated, the crystal oscillator has no waste and becomes efficient.

Furthermore, in the present invention, the IC chip has the basic IC terminals and additional IC terminals on a first surface layer, which is on a first insulating film, and the basic IC terminals and any two additional IC terminals among the additional IC terminals are electrically extended on a second surface layer that lies on an insulating film, which covers the first surface layer. As a result, the second surface layer can be formed as required using preformed IC chips that are common up to the first surface layer. Therefore the productivity of the crystal oscillator can be increased.

Moreover, in the present invention, in a case where, among the additional functions, the second oscillator output function is unnecessary, the operation/non-operation function of the first oscillator output function is achieved by the supply or stopping of the power supply to the first oscillator output function. As a result, when the first oscillator output function is made non-operating, the power supply is directly stopped. Therefore power saving can be facilitated.

BRIEF DESCRIPTION OF THE DRAWINGS

FIG. 1 is diagrams describing an embodiment of the crystal oscillator (VC-TCXO) of the present invention, wherein

FIG. 3 is diagrams describing the IC chip used in an embodiment of the present invention, wherein

FIG. 4 is diagrams describing the IC chip used in an embodiment of the present invention, wherein

FIG. 5 is diagrams describing a conventional example of a VC-TCXO, wherein

BEST MODE FOR CARRYING OUT THE INVENTION

Figure 1A:
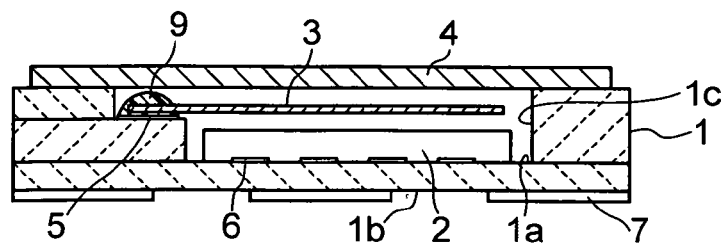
FIG. 1A is a cross-sectional view thereof.
Figure 1B:
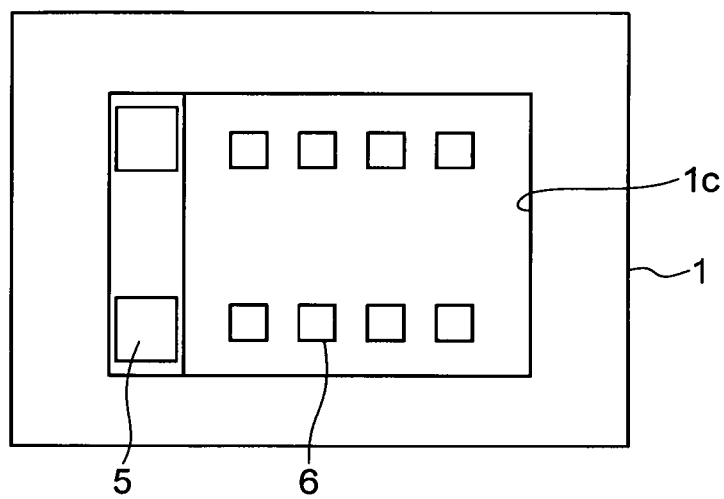
FIG. 1B and FIG. 1C are plan views of the inside bottom surface thereof, and the outside bottom surface thereof, respectively.
Figure 1C:
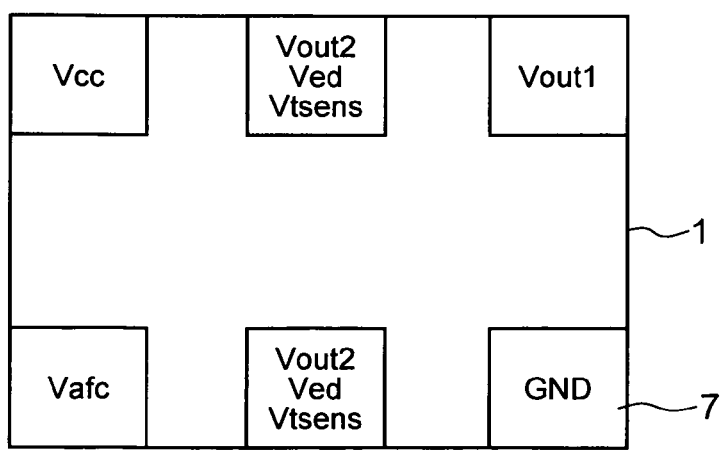

As follows is a description of an embodiment of a crystal oscillator of the present invention with reference to FIG. 1 (cross-sectional view, and plan views of the inside bottom surface of the chamber body, and the outside bottom surface) and FIG. 2 (circuit block of the interior of the IC chip).

Figure 9:
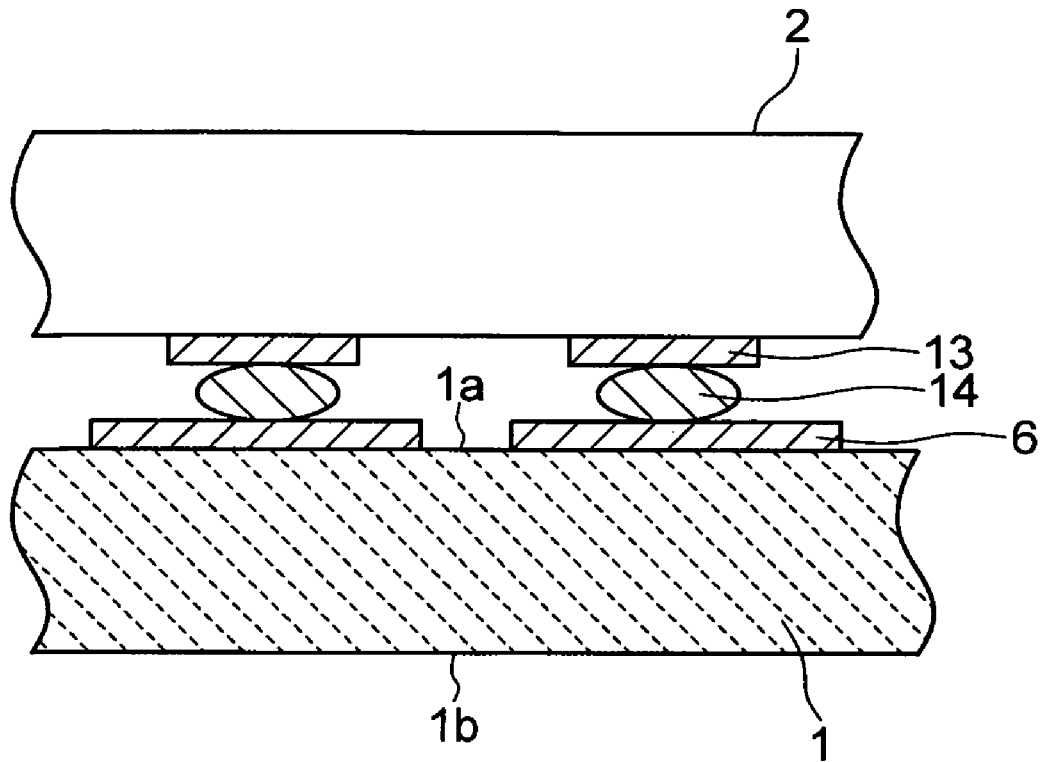
FIG. 9 is a sectionally enlarged cross-sectional view of a chamber body showing a conventional example of a joined state by means of ultrasound thermocompression.

The crystal oscillator of the present invention is, as mentioned above, a voltage controlled type VC-TCXO that has a temperature compensating function, and is provided with a basic function and additional functions. Furthermore, IC terminals 13 (refer to FIG. 9) of the circuit formation surface of the IC chip 2 are fixed to the circuit terminals 6, of which there are eight here, which are disposed on the inside bottom surface 1a of the concave-shaped cross-section chamber body 1, and both sides of one end portion of the crystal blank 3, in which lead-out electrodes 8b extend, are fixed to crystal holding terminals 5, which are provided on the stepped inside wall section of the chamber body 1, and these are hermetically sealed by joining a metal cover 4. The dimensions of the circuit terminals 6 provided on the inside bottom surface 1a of the chamber body 1 are larger than those of the IC terminals 13, and the IC chip 2 is fixed to the inside bottom surface 1a of the chamber body 1 by means of ultrasound thermocompression using a bump.

The outside bottom surface 1b of the chamber body 1 has, in a clockwise direction on the four corner portions thereof, a power terminal Vcc, a first oscillator output terminal Vout1, an earth terminal GND, and an AFC input terminal Vafc serving as basic mounting terminals 7. Furthermore, here the additional mounting terminals 7, which are two terminals among a second oscillator output terminal Vout2, operation/non-operation (Enable/Disable) input terminals Ved1 or Ved2, and a temperature output terminal, are disposed on an opposing central portion of the long sides of the outside bottom surface of the chamber body 1, to give a total of six mounting terminals 7. These basic mounting terminals 7a (Vcc, Vout1, Vafc, GND) and two additional mounting terminals 7b are electrically connected to the respectively corresponding circuit terminals 6, which are provided on the inside bottom surface 1a.

Figure 2:
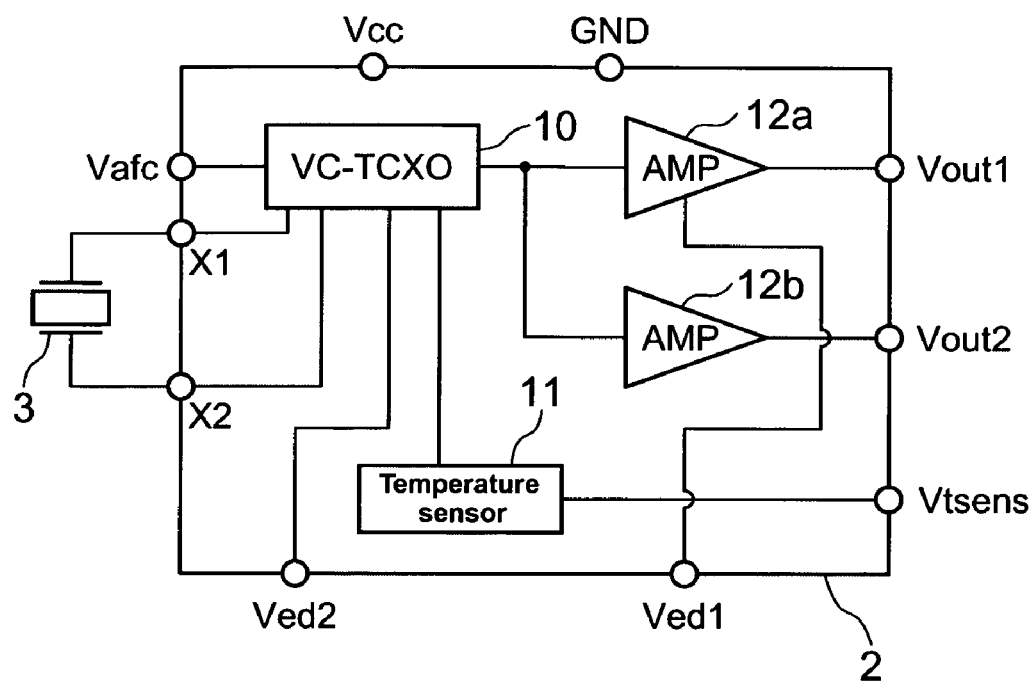
FIG. 2 is a circuit block diagram describing an embodiment of the VC-TCXO of the present invention, in particular the interior of the IC chip.

The IC chip 2, as mentioned above, integrates an external crystal resonator (crystal blank 3), and a temperature compensating device that is based on a temperature sensor 11 and a voltage controlled oscillation circuit, which serve as a basic construction of the VC-TCXO (refer to FIG. 2). As a result, a crystal oscillator of the present invention has for example, a first oscillator output function in which the oscillation frequency is controlled by a control voltage Vafc serving as an AFC voltage, and a temperature compensating function that compensates the frequency temperature characteristics according to a temperature compensation voltage corresponding to a detected temperature voltage Vtsens from the temperature sensor 11 for example.

Furthermore, as additional functions of the VC-TCXO of the present invention, a second oscillator output function, an operation/non-operation function, and a temperature voltage output function are provided beforehand. Specifically, in the same manner as mentioned above, the second oscillator output function branches the original first oscillator output Vout1 of the VC-TCXO, and with an object in preventing interference, respectively connects a first and a second buffer amplifier 12a and 12b thereto to obtain a first and a second oscillator output Vout1 and Vout2.

Moreover, the operation/non-operation function of the first oscillator output Vout1 has a first and a second configuration, wherein the first configuration, as mentioned above, turns the first buffer amplifier 12a in FIG. 2 ON/OFF (operates or stops) according to the signal from the first operation/non-operation input terminal Ved1. Furthermore, the newly added second configuration turns the VC-TCXO ON/OFF according to the signal from the second operation/non-operation terminal Ved2. The temperature voltage output function, as mentioned above, outputs as is, the detected temperature voltage Vtsens of the temperature sensor 11 of the temperature compensating devices.

Figure 3A:
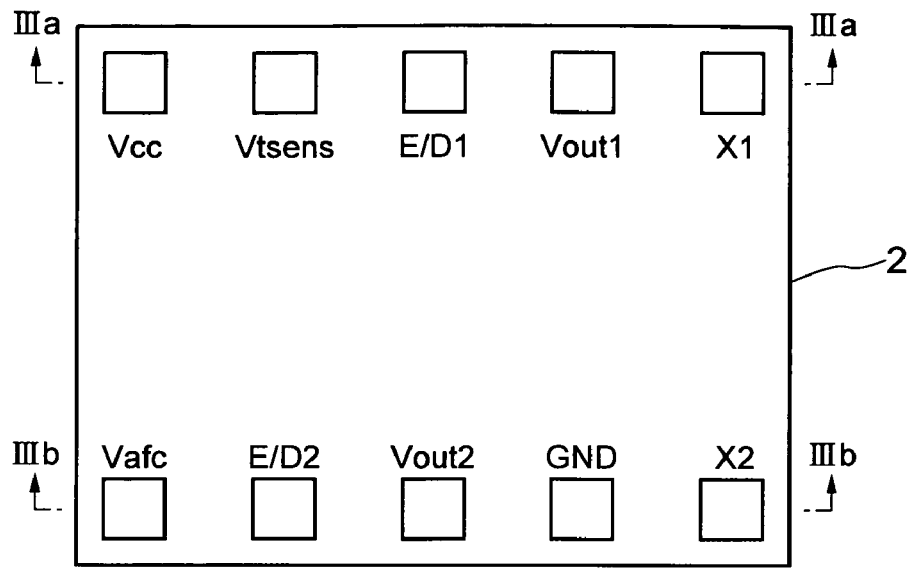
FIG. 3A is a plan view of a first surface layer thereof, FIG. 3B a cross-sectional view along the line IIIa-IIIa in FIG. 3A.
Figure 3B:
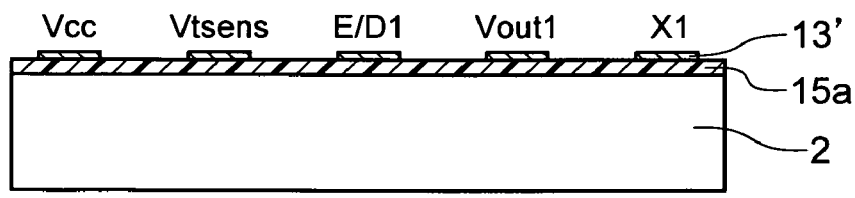
Figure 3C:
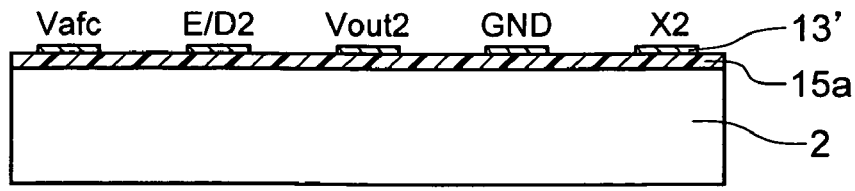
FIG. 3C is a cross-sectional view along the line IIIb-IIIb in FIG. 3A.

Additionally, as shown in FIG. 3 (plan view and cross-sectional view of the IC chip 2), on the first surface layer on the first insulating film (oxide film) 15a on the circuit formation surface of the IC chip 2, basic IC intermediate terminals 13a' (Vcc, Vout1, Vafc, GND) including a pair of crystal terminals (X1 and X2), and additional IC intermediate terminals 13b' (Vout2, Ved1, Ved2, Vtsns), giving a total of ten terminals, are uniformly formed, five on each opposing pair of sides along the long side of the IC chip 2.

Here, on the second surface layer on the second insulating film (polymer film) 15b formed on the first surface layer, basic IC intermediate terminals 13a (Vcc, Vout1, Vafc, GND) including crystal intermediate terminals 13a' (X1 and X2), and the two necessary terminals among the additional IC terminals 13b' (Vout2, Ved1, Ved2, Vtsens) are electrically led-out. Thus, the final basic IC terminals 13a and additional IC terminals 13b, giving a total of eight terminals, are formed. For example, a case where, of the additional functions, the second oscillator output function is unnecessary, and the operation/non-operation function of the first oscillator output Vout1 and the temperature voltage output function are demanded, is as follows.

Figure 4A:
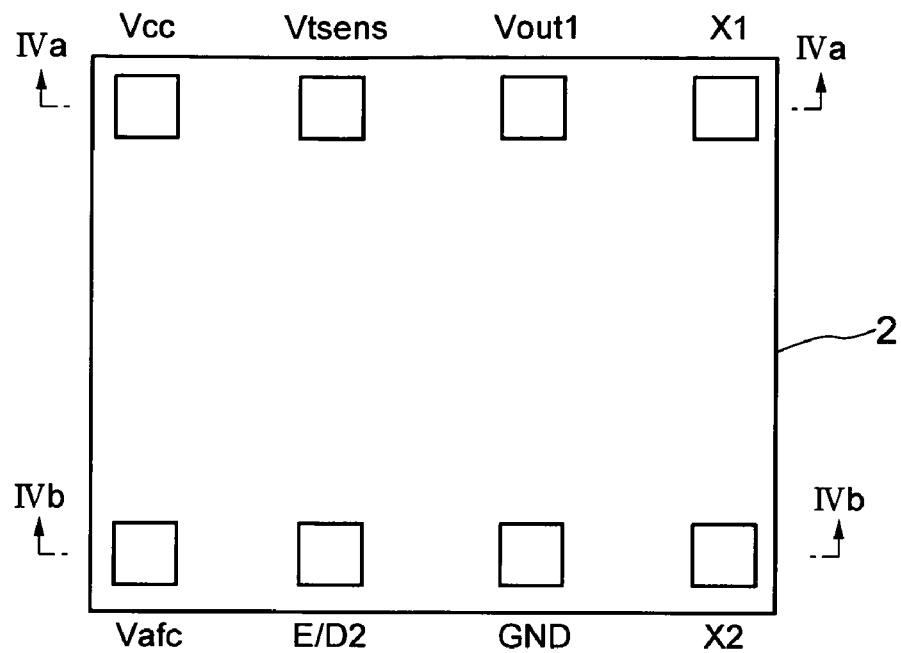
FIG. 4A is a plan view of a second surface layer.
Figure 4B:
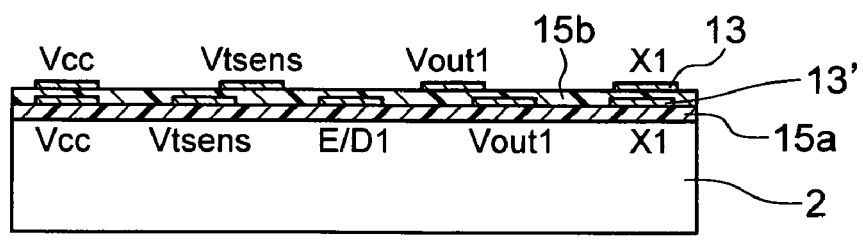
FIG. 4B is a cross-sectional view along the line IVa-IVa in FIG. 4A.
Figure 4C:
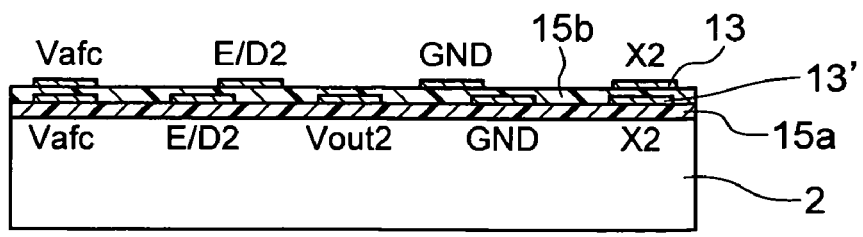
FIG. 4C is a cross-sectional view along the line IVb-IVb in FIG. 4A.
Figure 5A:
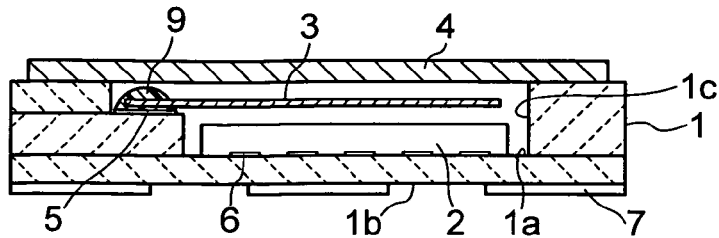
FIG. 5A is a cross-sectional view thereof.
Figure 5B:
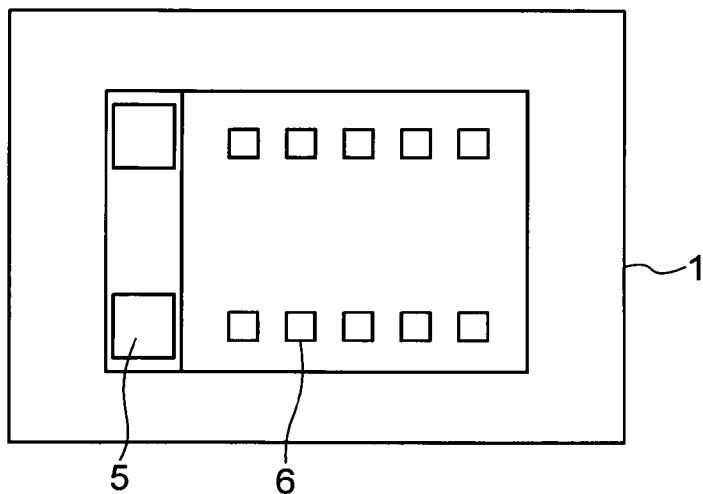
FIG. 5B and FIG. 5C are plan views of the inside bottom surface of the chamber body, and the outside bottom surface, respectively.
Figure 5C:
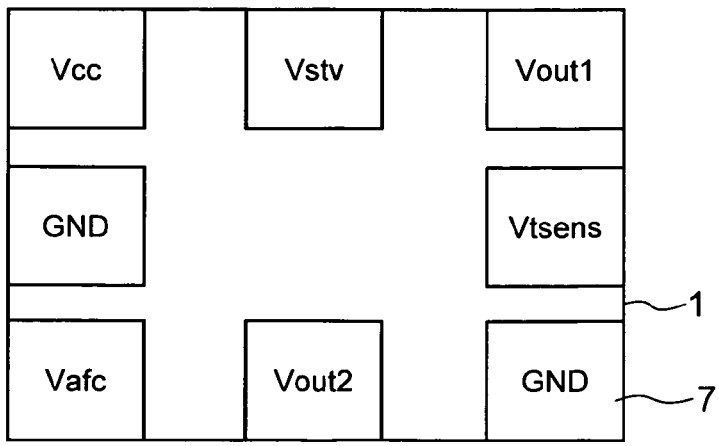
Figure 6:
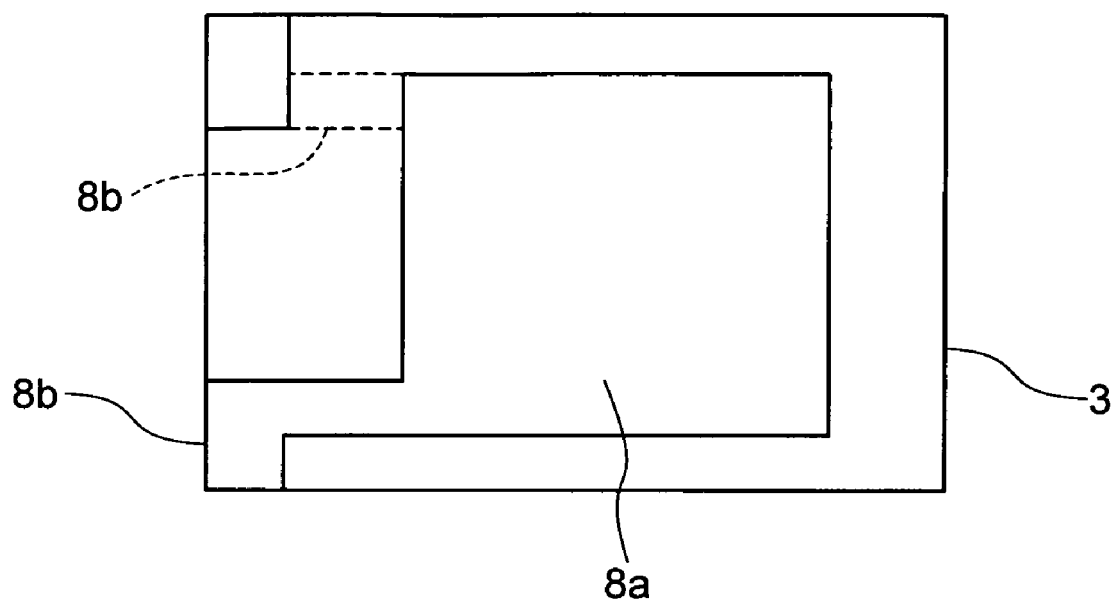
FIG. 6 is a plan view describing a crystal blank of a conventional example of a VC-TCXO.
Figure 7:
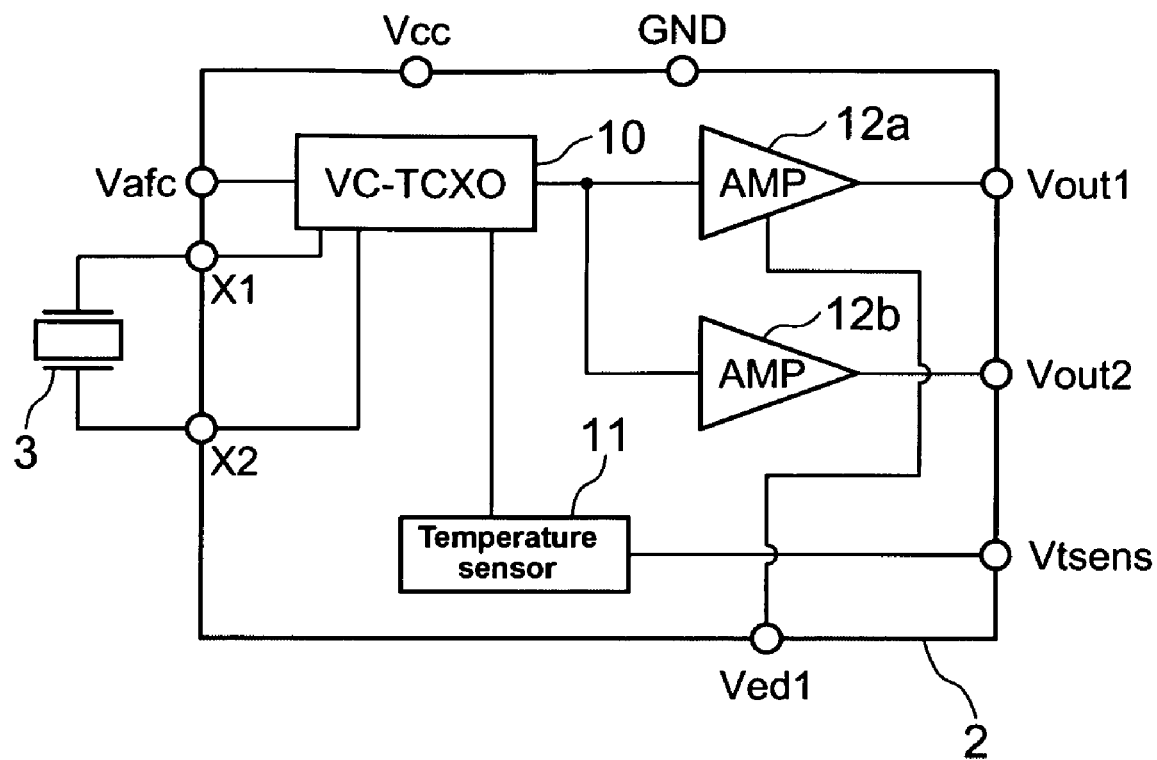
FIG. 7 is a diagram describing a conventional example of a multifunctional VC-TCXO, and in particular, is a circuit block diagram of the interior of an IC chip.
Figure 8A:
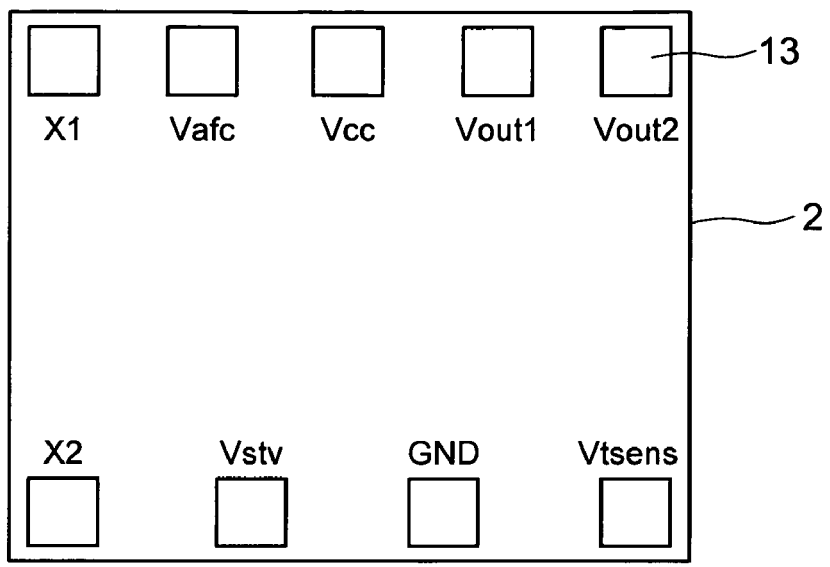
FIGS. 8A and 8B are plan views of the circuit formation surface formed on one principal surface of an IC chip used in conventional examples of a crystal oscillator.
Figure 8B:
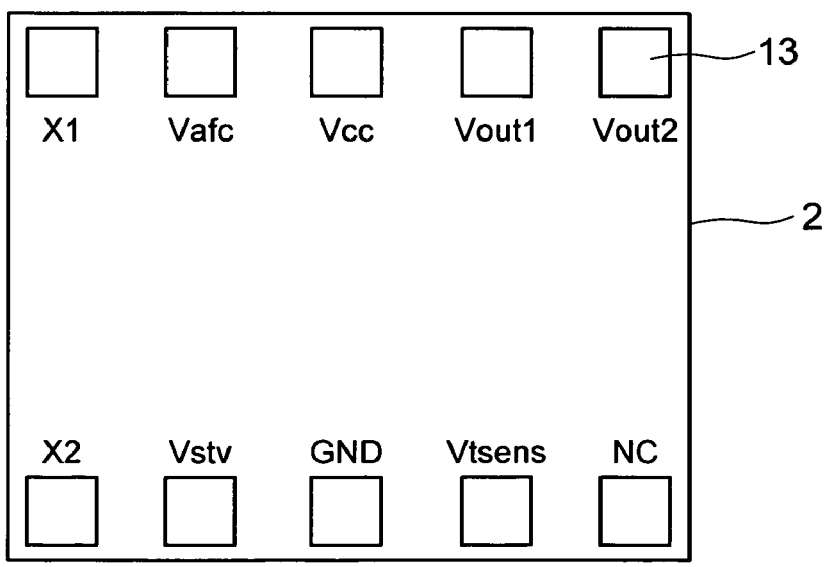

That is to say, as shown in FIG. 4A, the IC terminals 13 are formed such that the basic IC intermediate terminals 13a' (Vcc, Vout1, Vafc, GND) including the crystal terminals X1 and X2, and the operation/non-operation input intermediate terminal 13b' (here Ved2) and the temperature output intermediate terminal 13b' (Vtsens) among the additional IC intermediate terminals 13b', of the first surface layer of the IC chip 2 are extended to the second surface layer. In this case, the basic IC terminals 13a are, in the same manner as the basic mounting terminals 7, disposed in a clockwise direction in the order of Vcc, Vout1, GND, Vafc. Furthermore, in this example, the crystal intermediate terminals 13a' (X1 and X2) are disposed on the one end side, and the additional IC terminals 13b' (Vout2, Ved1, Ved2, Vtsens) are disposed between the basic IC intermediate terminals 13a'.

The circuit terminals 6 (eight terminals) provided on the inside bottom surface 1a of the chamber body 1, which are formed corresponding to these IC terminals 13, are connected electrically and mechanically by fixing by means of ultrasound thermocompression using a bump. However, the dimensions of the circuit terminals 6 are, as mentioned above, larger than those of the IC terminals 13. As a result, the circuit terminals 6, excluding the crystal terminals X1 and X2, are electrically connected to; the basic mounting terminals 7 (Vcc, Vout1, GND, Vafc) provided on the four corner portions of the outside bottom surface 1b of the chamber body 1, and the operation/non-operation input terminal 13 (Ved2) and the temperature output terminal (Vtsens) serving as the additional mounting terminals 7, which become the central portion of the long side of the IC chip 2.

According to such a construction, in addition to the first oscillator output function and the temperature compensation function, which result from the basic functions of voltage control provided beforehand, the IC chip 2 is integrated with a second oscillator output function, an operation/non-operation function of the first oscillator output Vout1, and a temperature voltage output function, which serve as additional functions. Furthermore, the total of ten IC intermediate terminals 13' for these basic functions and additional functions are formed on the first surface layer of the IC chip 2.

Moreover, in this example, the six terminals of the basic IC terminals 13a (Vcc, Vout1, GND, Vafc) including the crystal terminals X1 and X2, which correspond to the basic functions, and the two terminals of the additional IC terminals 13b corresponding to two functions of the three additional functions, giving a total of eight terminals, are led-out to the second surface layer of the IC chip 2. Thus, four IC terminals 13 are formed on each side along the length direction of the IC chip 2.

In this case, in comparison to the case of the conventional example wherein five IC terminals 13 are formed on each side of the IC chip 2, in the present embodiment the spacing between IC terminals 13 can be widened. As a result, the circuit terminals 6 formed on the inside bottom surface 1a of the chamber body 1 can be formed larger than the IC terminals 13. Accordingly, when the IC chip 2 is ultrasound thermocompressed to the inside bottom surface 1a of the chamber body 1, an acceptable range (clearance) is assured at the time of positioning the bumps provided on the IC terminals 13 on the circuit terminals 6, and they can be joined with certainty.

Furthermore, the mounting terminals 7 provided on the outside bottom surface 1b of the chamber body 1 are the four terminals of the basic mounting terminals 7 (Vcc, Vout1, GND, Vafc) corresponding to the basic functions excluding the crystal terminals X1 and X2, and the two terminals of the additional mounting terminals 7, giving a total of six terminals. Accordingly, there is one fewer terminal in comparison to the seven terminals of the conventional example, and since they can be disposed three on each opposing long side of the outside bottom surface 1b, the enhanced functionality of the crystal oscillator can be maintained, while facilitating miniaturization.

In this case, even if additional functions are added, the basic mounting terminals 7 (Vcc, Vout1, GND, Vafc) are, in a conventional manner, disposed in a clockwise direction on the four corner portions of the outside bottom surface 1b. Accordingly, in a case where temperature compensating data, including adjustments and measurements of the frequency, or the like, are written for the temperature compensating device within the IC chip 2 for example, the basic mounting terminals provided on the four corner portions are used as is, and the need for producing new jigs is eliminated.

Moreover, the IC chip 2 basically has all of; the second oscillator output function, the operation/non-operation function, and the temperature voltage output function as additional functions, and the additional IC terminals 13b corresponding to the necessary functions of the two terminals can be formed by changing the circuit pattern of the circuit formation surface. Accordingly, in comparison to a case where only the functions of two terminals among the second oscillator output function, the operation/non-operation function, and the temperature voltage output function are selected and integrated, there is no waste and it becomes efficient. Furthermore, here, since the second surface layer can be formed as required using a preformed IC chip 2 that is common up to the first surface layer, the productivity can be increased.

Moreover, in this embodiment, the two additional functions among the three are the operation/non-operation function of the first oscillator output, and the temperature voltage output function, and the second oscillator output function is excluded. Accordingly, the operation/non-operation function of the first oscillator output can stop the first oscillator output Vout1 by means of a signal from the operation/non-operation input terminal ed2 of the second configuration. As a result, the operation of the VC-TCXO is directly stopped. Therefore, energy saving can be facilitated.

(Other Aspects)

In the aforementioned embodiment, although three additional functions, namely a second oscillator output function, an operation/non-operation function, and a temperature voltage output function were provided beforehand, it is in no way limited to this, and it is possible to provide, for example, a temperature data output function relating to the frequency temperature characteristics of the crystal resonator, or the like (refer to Patent Document 1 mentioned above). In this case, it is acceptable for the temperature data output function to be added such that four additional functions are provided beforehand, or for unnecessary additional functions (the second oscillator output function for example) to be excluded, and the final number of IC terminals on the second surface layer to be made eight terminals.

Furthermore, although the IC chip 2 and the crystal blank 3 are accommodated and hermetically sealed in the concave-shaped cross-section chamber body 1, it is possible to apply the crystal oscillator of the present invention in a similar manner, in a case where the chamber body 1 is H-shaped in cross-section for example, and the crystal blank 3 is accommodated and hermetically sealed in one concave portion, the IC chip 2 is accommodated in the other concave portion, and the mounting terminals are formed on the open end surface. In this case, it is the same even in a case where a mounting substrate that accommodates the IC chip 2 is joined to the bottom surface of a crystal resonator in which the crystal blank 3 is hermetically sealed. However, in the embodiment of the crystal oscillator of the present invention, in a case where the cross-section of the chamber body 1 is made a concave shape, the inside bottom surface that accommodates the IC chip 2 by means of an inside wall stepped portion holding one end portion of the crystal blank 3 becomes smaller. Therefore it is preferable as a crystal oscillator in comparison to a case where the cross-sectional shape of the chamber body 1 is made an H-shape.

What is claimed is:

1. A voltage controlled temperature compensated crystal oscillator in which an IC chip and a crystal blank are accommodated in a chamber body, and at the very least, the crystal blank is hermetically sealed, and mounting terminals that are electrically connected to said IC chip, are provided on an outside bottom surface of said chamber body, which is made rectangular in plan view, said IC chip has basic functions consisting of a first oscillator output function, wherein a voltage variable capacitative element to which a control voltage is applied is inserted within an oscillator closed loop, and a temperature compensating function that at the very least has a temperature sensor and compensates for the frequency temperature characteristics arising in the crystal blank, and additional functions other than said basic functions, comprising of a second oscillator output function, an operation/non-operation function of the first oscillator output, and a temperature voltage output function, and one principal surface that serves as a circuit formation surface of said IC chip has IC terminals, and said IC terminals comprise, at the very least, basic IC terminals composed of a pair of crystal terminals, a power terminal, a first oscillator output terminal, a control voltage input terminal, and an earth terminal, which correspond to said basic functions, and two additional IC terminals that correspond to said additional functions, and said mounting terminals have; basic mounting terminals that are electrically connected to said basic IC terminals excluding a pair of crystal terminals, namely a power terminal, a first oscillator output terminal, a control voltage input terminal, and an earth terminal, and additional mounting terminals that are electrically connected such that they correspond to said additional functions, wherein the two additional IC terminals correspond to two functions selected from among:
i) a second oscillator output function,
ii) an operation/non-operation function of a first oscillator output, and
iii) a temperature voltage output function, which are selectively connected according to changes in a circuit pattern of a surface layer of said circuit formation surface, and said basic mounting terminals are provided on four corner portions of an outside bottom surface of said chamber body, and the two additional mounting terminals that are connected to the two additional IC terminals are provided on a central portion of a long side facing said outside bottom surface.

2. A voltage controlled temperature compensated crystal oscillator according to claim 1, wherein said IC chip has said basic IC terminals and additional IC terminals on a first surface layer, which is on a first insulating film, and said basic IC terminals and any two additional IC terminals among said additional IC terminals are electrically extended on a second surface layer that lies on an insulating film, which covers said first surface layer.

3. A voltage controlled temperature compensated crystal oscillator according to claim 1, wherein in a case where, among said additional functions, the second oscillator output function is unnecessary, then in the operation/non-operation function of said first oscillator output function, said first oscillator output function is operated directly or is non-operated.

\* \* \* \* \*